US010288696B2

(12) United States Patent
Chiu et al.

(10) Patent No.: US 10,288,696 B2
(45) Date of Patent: May 14, 2019

(54) INTELLIGENT DIAGNOSIS SYSTEM FOR POWER MODULE AND METHOD THEREOF

(71) Applicant: Industrial Technology Research Institute, Hsinchu Hsien (TW)

(72) Inventors: Chih-Chung Chiu, Hsinchu (TW); Chih-Ming Tzeng, Hsinchu (TW); Li-Ling Liao, Hsinchu (TW); Yu-Lin Chao, Hsinchu (TW); Chih-Ming Shen, Hsinchu (TW); Ming-Kaan Liang, Hsinchu (TW); Chun-Kai Liu, Hsinchu (TW); Ming-Ji Dai, Hsinchu (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 234 days.

(21) Appl. No.: 15/352,989

(22) Filed: Nov. 16, 2016

(65) Prior Publication Data

US 2018/0136287 A1    May 17, 2018

(51) Int. Cl.
  *G01R 31/40* (2014.01)
  *G01R 31/00* (2006.01)
  (Continued)

(52) U.S. Cl.
  CPC ............ *G01R 31/40* (2013.01); *G01R 31/003* (2013.01); *H02P 29/68* (2016.02); *G01R 21/06* (2013.01); *H02P 27/08* (2013.01)

(58) Field of Classification Search
  CPC ........ G01R 31/40; G01R 21/06; G01R 27/26; H05K 5/03; H05K 5/0017; H02P 27/08
  (Continued)

(56) References Cited

U.S. PATENT DOCUMENTS 5,528,446 A  *  6/1996  Sankaran ............. G01R 31/006
                                                361/103
5,877,419 A     3/1999  Farokhzad
                        (Continued)

FOREIGN PATENT DOCUMENTS

CN      103226185 A    7/2013
CN      105335602 A    2/2016
                  (Continued)

*Primary Examiner* — Giovanni Astacio-Oquendo
(74) *Attorney, Agent, or Firm* — Muncy, Geissler, Olds & Lowe, P.C.

(57) ABSTRACT

An intelligent diagnosis system for a power module. The system includes a power module, a hardware checking module and a diagnostic module. The power module has a temperature sensing element for obtaining a temperature difference between a starting minimum temperature and a current temperature. The hardware checking module has a current sensing element, a voltage sensing element and a magnetic coupling closed loop detection element for obtaining the current, the output voltage and the input voltage of the power module, and the hardware loop status, respectively. The diagnostic module calculates the number of cycles that have been operated, a measured impedance and an instantaneous power based on those measurement results, and calculating a risk index based on the number of cycles that have been operated, the temperature difference, the measured impedance, the instantaneous power and the hardware loop status, thereby determining the accumulation of the abnormality index record.

18 Claims, 12 Drawing Sheets

(51) Int. Cl.
  *H02P 29/68* (2016.01)
  *G01R 21/06* (2006.01)
  *H02P 27/08* (2006.01)

(58) Field of Classification Search
  USPC .................................. 324/764.01, 537, 500
  See application file for complete search history.

(56) References Cited

U.S. PATENT DOCUMENTS

| | | | |
|---|---|---|---|
| 6,563,211 B2 | 5/2003 | Fukada et al. | |
| 7,081,764 B1* | 7/2006 | Pandya | H04B 3/487 |
| | | | 324/539 |
| 8,004,304 B2 | 8/2011 | Tametani et al. | |
| 8,027,132 B2 | 9/2011 | Omaru | |
| 8,994,376 B2* | 3/2015 | Billeres | A61B 5/097 |
| | | | 324/260 |
| 2008/0303138 A1* | 12/2008 | Flett | H01L 23/473 |
| | | | 257/714 |
| 2012/0119569 A1 | 5/2012 | Karalis et al. | |
| 2015/0154364 A1 | 6/2015 | Biasi et al. | |
| 2015/0190659 A1* | 7/2015 | Kohler | A61N 7/02 |
| | | | 600/411 |
| 2017/0234945 A1* | 8/2017 | Findeklee | G01R 33/288 |
| | | | 324/313 |
| 2017/0319097 A1* | 11/2017 | Amthor | A61B 5/055 |

FOREIGN PATENT DOCUMENTS

| | | |
|---|---|---|
| JP | 2011050200 A | 3/2011 |
| TW | 507234 B | 10/2002 |
| TW | 201131943 A | 9/2011 |
| TW | I356565 B | 1/2012 |
| TW | 201407945 A | 2/2014 |
| TW | I458249 B | 10/2014 |

\* cited by examiner

INTELLIGENT DIAGNOSIS SYSTEM FOR POWER MODULE AND METHOD THEREOF

BACKGROUND

1. Technical Field

The disclosure relates to power module checking mechanisms, and, relates to an intelligent diagnosis method for a power module and a system thereof.

2. Description of Related Art

Intelligent Power Modules (IPMs) are widely used in motor drive control systems, such as lifts, electric vehicles, and so on, and mainly comprise a bare copper structure of Direct Bond Copper (DBC) with leads and encapsulated in a mold, and a drive control circuit.

The operating environments of the power module are often stringent, and the power modules also play a key role in the overall drive control system. However, abnormal operations caused by external factors, such as thermal runaway, over current, over voltage and etc., may result in a burned power module, which leads to the sudden failure of the overall system and unpredictable losses. More specifically, when an intelligent power module is used in an intelligent chemical plant or a wind turbine site, it may be more beneficial if the probability of damage of the internal components can be predicted and the components evaluated and replaced in advance than carrying out replacement and maintenance after a sudden failure has occurred, because the failure is likely to result in unpredictable damages to the components, or even cause the machine to shut down. The impact level of which is difficult to estimate.

SUMMARY

The disclosure provides an intelligent diagnosis system for a power module. The intelligent diagnosis system includes a power module, a hardware checking module, and a diagnostic module. The power module is provided with a temperature sensing element configured for measuring a starting minimum temperature and a current temperature of the power module and determining a temperature difference between the starting minimum temperature and the current temperature. The hardware checking module is provided on one side of the power module, and includes a current sensing element, a voltage sensing element, and a magnetic coupling closed loop detection element. The current sensing element is configured for sensing a current in the power module. The voltage sensing element is configured for measuring an output voltage and an input voltage of the power module. The magnetic coupling closed loop detection element is configured for performing a self-test on a current status of the hardware to obtain a hardware loop status. The diagnostic module is connected with the power module and the hardware checking module, and configured for calculating a number of cycles that have been operated based on the current temperature and the current sensed by the current sensing element and calculating a measured impedance based on the output voltage, the input voltage and the current, so as to calculate an instantaneous power based on the measured impedance, the output voltage and the current. The diagnostic module calculates a risk index based on the number of cycles operated, the temperature difference, the measured impedance, the instantaneous power and the hardware loop status.

The disclosure further provides an intelligent diagnosis method for a power module. The intelligent diagnosis method includes: measuring a temperature, a current, an input voltage and an output voltage of a power module; performing a self-test on a current status of the hardware; calculating a number of cycles that have been operated by the power module based on the temperature and the current; calculating a measured impedance based on the output voltage, the input voltage and the current; calculating an instantaneous power based on the measured impedance, the output voltage and the current; and calculating a risk index based on the number of cycles operated, the temperature, the measured impedance, the instantaneous power and the hardware loop status.

The disclosure further provides a current sensing element provided on a lead of a power module in a surface mounted manner, wherein when a current is flowing through the lead and creating a magnetic field around the lead, the current sensing element senses the magnetic field and calculates a value of the current flowing through the lead.

The disclosure further provides a magnetic coupling closed loop detection element provided at each of a plurality of insulated gate bipolar transistors in a three-phase bridge driver in a power module for detecting a current hardware loop status of the respective insulated gate bipolar transistor.

BRIEF DESCRIPTION OF DRAWINGS

The present invention will be apparent to those skilled in the art by reading the following description of preferred embodiments of the present invention, with reference to the attached drawings.

DETAILED DESCRIPTION

The disclosure is described by the following specific embodiments. Those with ordinary skills in the arts can readily understand other advantages and functions of the disclosure after reading the disclosure of this specification. The disclosure may also be practiced or applied with other different implementations. Based on different contexts and applications, the various details in this specification can be modified and changed without departing from the spirit of the disclosure.

Figure 1:
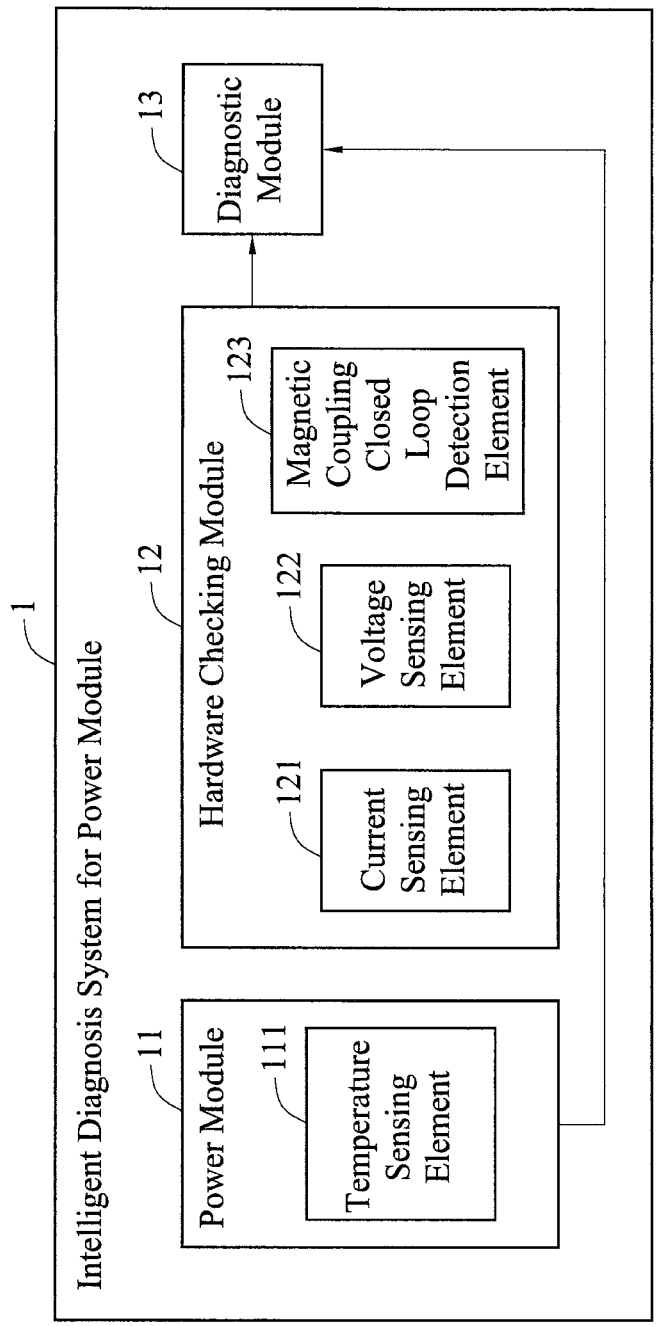
FIG. 1 is a block diagram depicting an intelligent diagnosis system for a power module in accordance with the disclosure.

Referring to FIG. 1, a block diagram depicting an intelligent diagnosis system for a power module in accordance with the disclosure is shown. The disclosure proposes risk index diagnosis and prediction in the intelligent diagnosis system in order to reduce unpredictable failures of the power module in a driver, which is an improvement over the provision of a single temperature sensing mechanism or an over current protection mechanism in the existing power modules. The disclosure proposes the provision of a hardware checking mechanism and its relative circuits in the power module.

As shown in FIG. 1, the intelligent diagnosis system 1 for a power module according to the disclosure includes a power module 11, a hardware checking module 12 and a diagnostic module 13.

A temperature sensing element 111 is provided on the power module 11 for measuring a starting minimum temperature and a current temperature of the power module 11 and obtaining the difference of the two. The temperature behavior of the power module 11 reflects the current status of the power module 11, so the temperature sensing element 111 is provided in the power module 11 for measuring the starting minimum temperature and the current temperature of the power module 11.

The hardware checking module 12 is provided on one side of the power module 11, and includes a current sensing element 121, a voltage sensing element 122 and a magnetic coupling closed loop detection element 123, wherein the current sensing element 121 is configured for sensing a current in the power module 11. The voltage sensing element 122 is configured for measuring an output voltage and an input voltage of the power module 11. The magnetic coupling closed loop detection element 123 is configured for detecting the status of the hardware loop. Simply put, the disclosure provides the hardware checking module 12 in the intelligent diagnosis system 1 for a power module in order to determine the status of the power module 11, including the current and the voltage, and determining if the closed loop is closed or not. The measured current, output voltage and input voltage can be used for calculating impedances or power for diagnosing the status of the power module 11.

The diagnostic module 13 is connected with the power module 11 and the hardware checking module 12 for calculating the number of cycles that have been operated by the power module 11 based on the current temperature sensed by the temperature sensing element 111 and the current measured by the current sensing element 121 in the hardware checking module 12. The power module 11 includes a plurality of insulated gate bipolar transistors and has a design of three phases and six arms. In other words, the number of cycles can be obtained by taking the integral of the continuous operating time and the instantaneous maximum current during the operation of the 3-phase 6-arm in the power module, and thus the term "the number of cycles operated" used herein refers to the integral of the operating time of the gate of each arm in the power module 11.

The diagnostic module 13 is further configured for calculating a measured impedance during operations of the power module 11 based on the output voltage and the input voltage measured by the voltage sensing element 122 and the current sensed by the current sensing element 121. In addition, an instantaneous power of the power module 11 is calculated based on the measured impedance, the output voltage and the current.

The diagnostic module 13 is further configured for calculating a risk index based on the number of cycles operated, the temperature difference, the measured impedance, the instantaneous power and the hardware loop status obtained before. The disclosure includes the above five measurement information (data) for determining if the device is on the brink of danger or being damaged. The disclosure uses the five measurement information to generate a risk index for indicating the risk level or damage level of the device. Simply put, when the risk index is greater than a default value, this means the power module 11 is on the brink of danger or damage, and an abnormality index record is accumulated accordingly. The more critical the risk, the faster the abnormality index record is accumulating. For example, a standard level of risk may entail the accumulation of the abnormality index record every half a second, whereas a high level of risk may cause the abnormality index record to be accumulated every 0.1 second.

Furthermore, when the abnormality index record accumulates over a preset warning value, the diagnostic module 13 can generate a warning message, which can be displayed on a screen or be send, for example, to notify the relevant personnel that the power module 11 inside the device is likely going to break.

As described above, the operating status of the power module 11 is obtained through continuous detection, and the accumulation of the abnormality index record assists a user to determine if the power module 11 requires maintenance/replacement. The above scenario results from the determination of the status of the device. However, in some scenarios, the power module 11 could be damaged immediately if no immediate action was taken. In this case, if warning is still issued based on the accumulation of the abnormality index record, the immediate damage caused by the failure of the power module 11 may not be prevented from occurrence in time.

In order to prevent this from happening, when the magnetic coupling closed loop detection element 123 detects that there is an abnormality in the status of the hardware loops, the diagnostic module 13 immediately generates an abort command to stop the operation of the power module 11. In addition, when the temperature difference, the measured impedance, or the instantaneous power exceeds a respective threshold value, which implies the possibility of an immediate damage of the power module 11, the diagnostic module 13 similarly issues an abort command to stop the operation of the power module 11. The immediate abort condition will be recorded for subsequent reference.

The disclosure uses the above mechanisms to provide risk-index diagnosis and prediction for the intelligent diagnosis system 1 for a power module. This not only predicts the risk index of the power module 11 using an intelligent checking mechanism, but the user is able to observe the operations of the power module 11 through the accumulation of the abnormality index record, thus enabling effective early warning and maintenance before failing of the power module 11.

Figure 2:
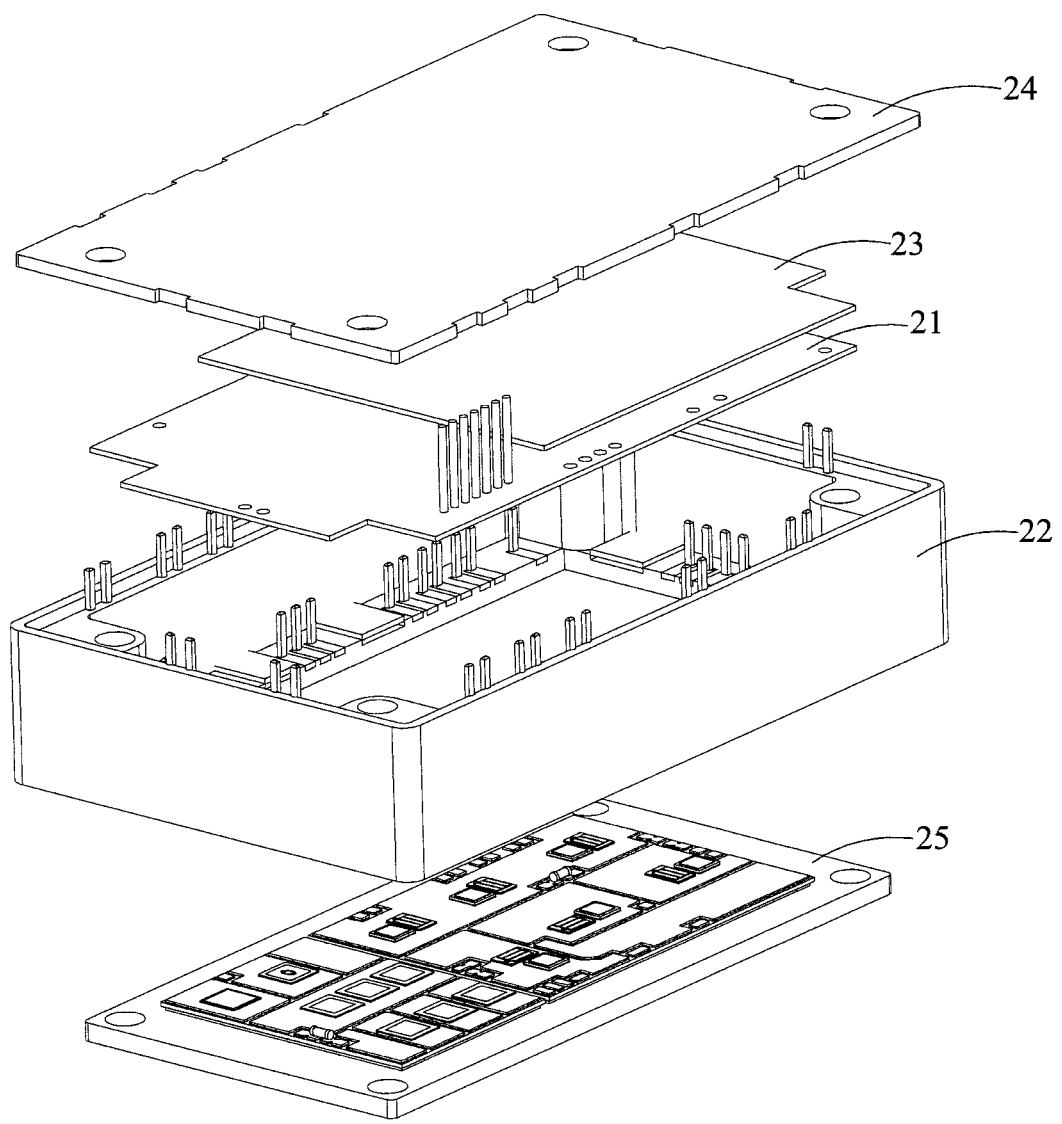
FIG. 2 is a schematic diagram depicting the appearance of the intelligent diagnosis system for a power module in accordance with an embodiment of the disclosure.

Referring to FIG. 2, a schematic diagram depicting the appearance of the intelligent diagnosis system for a power module in accordance with an embodiment of the disclosure is shown. The intelligent diagnosis system for a power module includes a power module 21, an upper cover plate 24 and a lower cover plate 25. The disclosure proposes the hardware checking module for data detection and the diagnostic module. The hardware checking module can be provided on a hardware checking circuit board 22, and the diagnostic module can be provided on a control board 23.

In an embodiment, the hardware checking circuit board 22 and the control board 23 are realized in the form of circuit boards. The hardware checking circuit board 22 is provided at one side of the power module 21. The control board 23 and the power module 21 are electrically connected with the hardware checking circuit board 22. Various sensing elements in the power module 21 and the hardware checking circuit board 22 are able to obtain data and results, such as the temperature, the current, the voltage or current status of the hardware loops, and they are transmitted to the control board 23 for calculation and analysis in order to obtain a risk index. In other words, the hardware checking module includes components, such as electronic elements, firmware, and etc. inside the hardware checking circuit board 22, and the diagnostic module includes components such as electronic elements, firmware, and etc. inside the control board 23.

Figure 3:
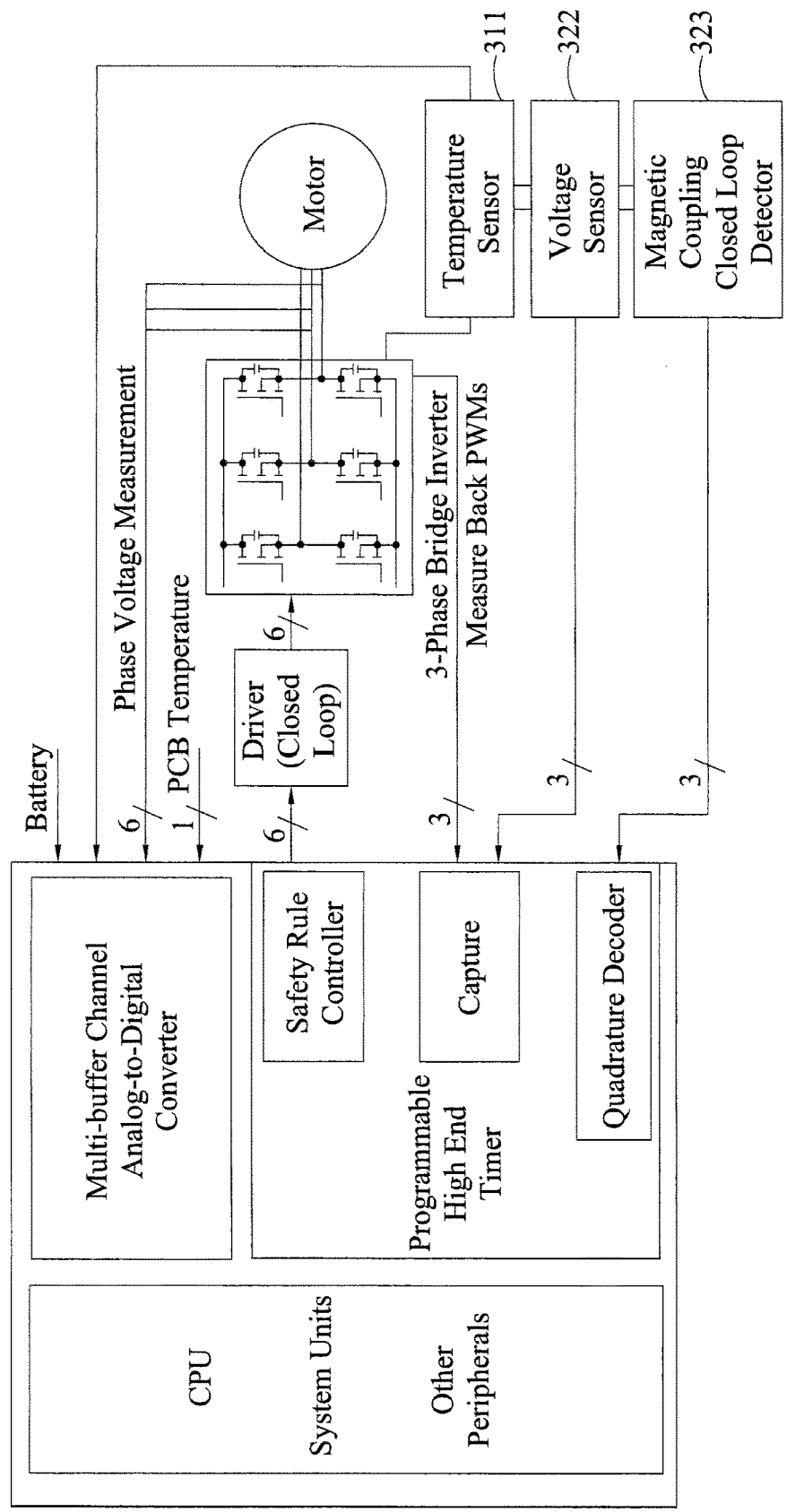
FIG. 3 is a schematic diagram depicting the internal relationships of the intelligent diagnosis system for a power module in accordance with an embodiment of the disclosure.

Referring to FIG. 3, a schematic diagram depicting the internal relationships of the intelligent diagnosis system for a power module in accordance with an embodiment of the disclosure is shown. The operation of a motor is controlled by a 3-phase bridge driver (i.e., a 3-phase 6-arm driving loop). The 3-phase bridge driver includes six arms, the open/close of each arm decides how circuit is conducted, thereby controlling the operation of the motor. A temperature sensor 311, a voltage sensor 322, and a magnetic coupling closed loop detector 323 are provided in the intelligent power module for self-testing the current hardware loop status.

Figure 4B:
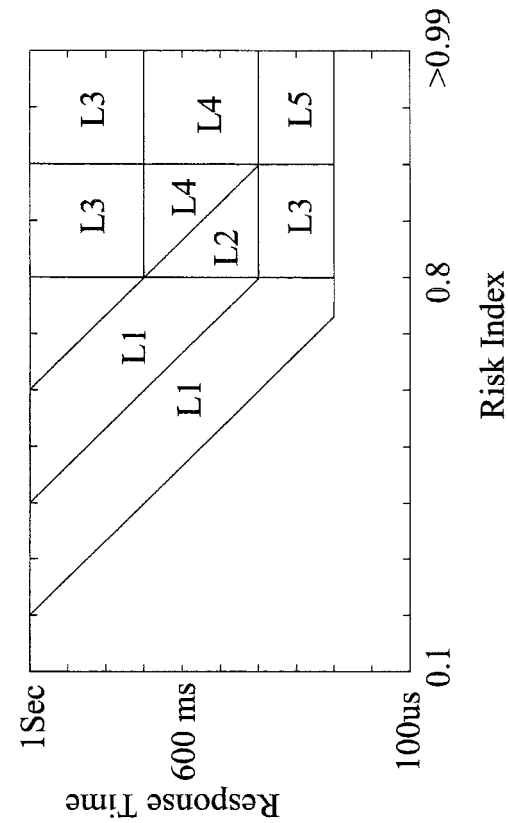
FIGS. 4A and 4B are diagrams illustrating the relationship between a risk index and a response time in the intelligent diagnosis system for a power module in accordance with an embodiment of the disclosure.
Figure 4A:
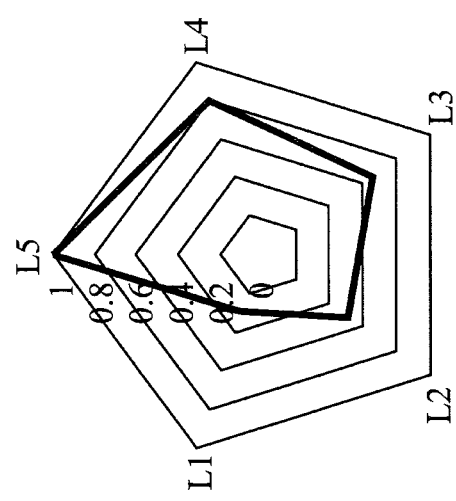

Referring to FIGS. 4A and 4B, diagrams illustrating the relationship between the risk index and a response time in the intelligent diagnosis system for a power module in accordance with an embodiment of the disclosure are shown. As noted earlier, the various sensing elements measure the temperature, the current, the voltage and etc. of the power module, which can be used to calculate the number of cycles that have been operated and the measured impedance. These detected data and the calculated data can be integrated to generate a risk index.

As shown in FIG. 4A, the disclosure categorizes the risk indices into five levels, from L1 to L5. Normally, it is designed that a real risk exists above L3. In an embodiment, various sensed values or data will create a value less than or equal to 1 after calculation as the risk index. For example, a risk index of 1, which is placed at L5, indicates very high risk. In addition, a risk index of 0.3, which is placed between L2 and L3, indicates a not-urgent risk. The risk indices will influence how quickly the abnormality index record is accumulated.

As shown in FIG. 4B, the horizontal axis indicates the risk index, and the vertical axis indicates the response time. For example, if the risk index is 0.8 and the risk level is L4, then a record is every 600 ms, that is, the abnormality index record is incremented once (e.g., plus one) every 600 ms. In other words, the more critical the risk, the shorter the response time. A more critical risk means that the abnormality index record is to be incremented in a very short period of time. On the other hand, if the risk is not so urgent, the abnormality index record can be incremented after a longer interval. As the abnormality index record is incremented at a faster speed or the value of the abnormality index record is getting larger, it is more likely that the power module is in a bad state.

Therefore, after the detection mechanism of the hardware checking module returns the operating status of the power module, the diagnostic module in the control board then starts real-time analysis, which may generate one or more of the five risk indices. Based on these risk indices, the diagnostic module can determine if there is immediate danger. If the determined result indicates a certain risk level, the diagnostic module starts accumulating and storing the abnormality index record. In the case of immediate danger, such as thermal runaway, over voltage, short circuit or the like, the control board will immediately interrupt the output of the drive circuit and record this major failure.

The provisions and applications of each of the sensing elements will be described as follow.

Figure 5A:
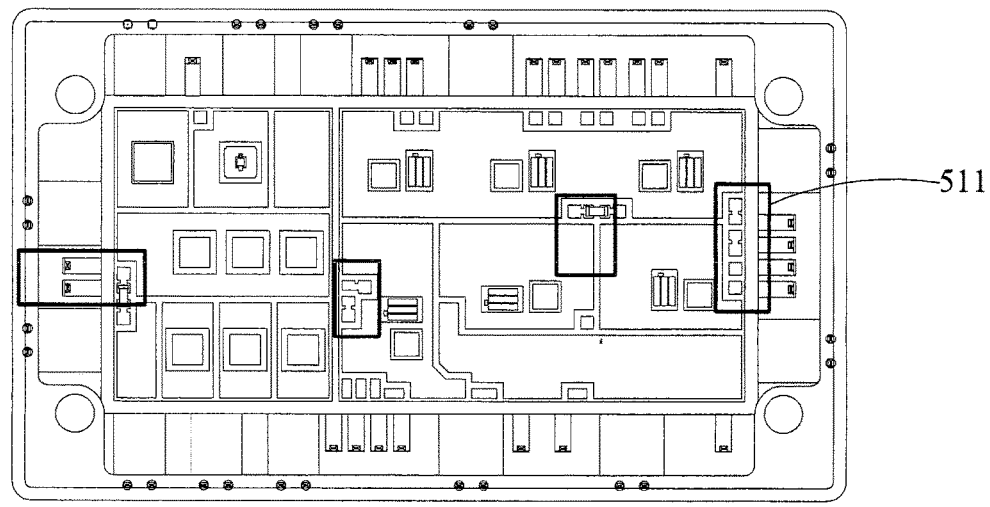
FIGS. 5A and 5B are diagrams illustrating the locations of temperature sensing elements in the intelligent diagnosis system for a power module in accordance with the disclosure.
Figure 5B:
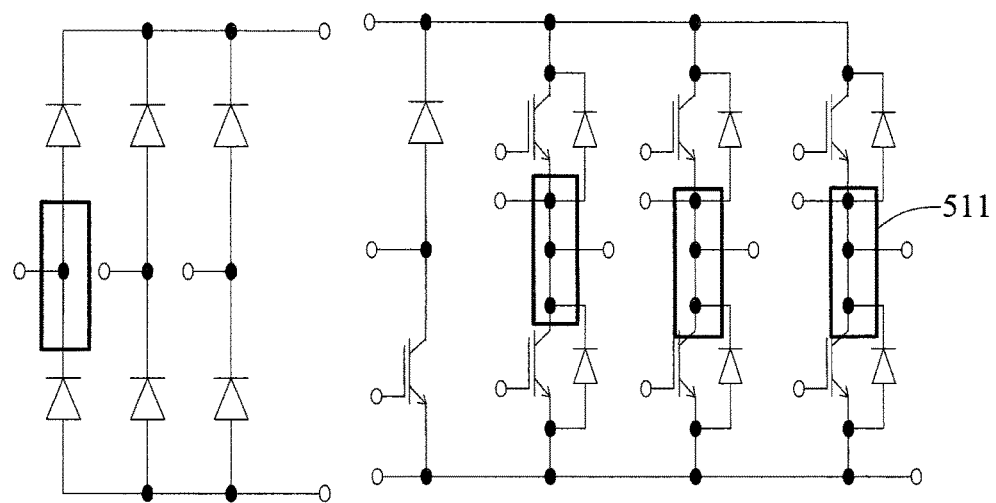

Referring to FIGS. 5A and 5B, diagrams illustrating the locations of the temperature sensing elements in the intelligent diagnosis system for a power module in accordance with the disclosure are shown. In FIG. 5A, the locations of temperature sensing elements 511 inside the power module are shown. The temperature sensing elements 511 are provided in the 3-phase 6-arm drive circuit (right-hand block) and a rectifier circuit (left-hand block), and the temperature sensing elements 511 are provided specifically at the circuits of the three phases of the 3-phase bridge driver in the power module. The measurements provided by the temperature sensing elements 511 are subjected to a first-order filter amplification by the hardware checking module in the hardware checking circuit board 22 (FIG. 2), and are transmitted to the control board 23 (FIG. 2) for reading and analysis by the diagnostic module therein.

In addition, FIG. 5B is an equivalent circuit of FIG. 5A. The rectifier module or a bridge rectifier is shown on the left-hand side. The 3-phase 6-arm drive circuit is shown on the right-hand side. The temperature sensing elements 511 are provided at the three bridging areas for sensing the temperatures of the insulated gate bipolar transistors at the bridging areas.

Figure 6A:
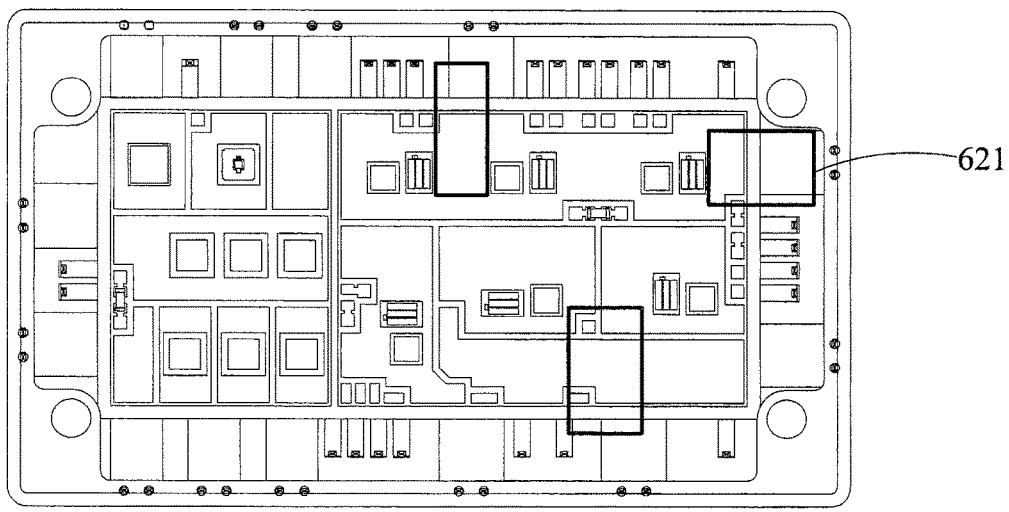
FIGS. 6A and 6B are diagrams illustrating the locations of current sensing elements in the intelligent diagnosis system for a power module in accordance with the disclosure.
Figure 6B:
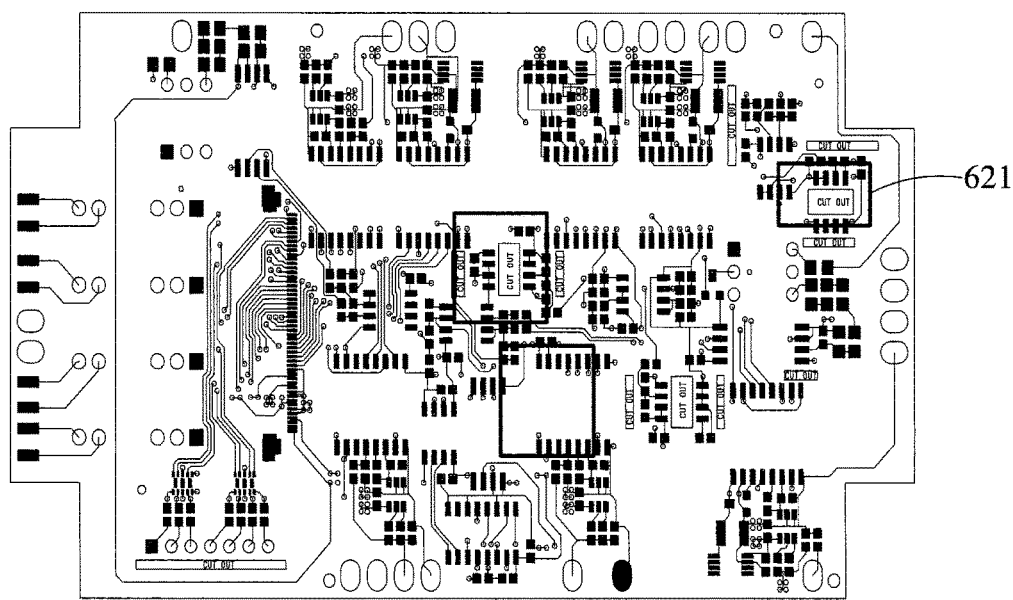

Referring to FIGS. 6A and 6B, diagrams illustrating the locations of the current sensing elements in the intelligent diagnosis system for a power module in accordance with the disclosure are shown. In FIG. 6A, locations of current sensing elements 621 in the power module are shown. The current sensing elements 621 are provided at locations of the U-V-W phases in the 3-phase bridge driver. The current sensing elements 621 can be Hall sensors. In other words, the current sensing elements 621 are provided on the U-phase, the V-phase and the W-phase coils of the 3-phase bridge driver in the power module. The measurements provided by the current sensing elements 621 are subjected to a first-order filter amplification by the hardware checking module in the hardware checking circuit board 22 (FIG. 2), and are transmitted to the control board 23 (FIG. 2) for reading and analysis by the diagnostic module therein.

FIG. 6B indicates the locations of the current sensing elements 621 in the hardware checking circuit board 22. The hardware checking circuit board 22 is provided at one side of the power module. The current sensing elements 621 in accordance with the disclosure are directly provided at where the wires are in the power module. Through electromagnetic sensing mechanism, magnetic fields are sensed in order to derive the currents. This is unlike the existing current sensing technique in which leads are extended outside the power module for current sensing. Thus, the disclosure is beneficial for the minimization of the overall volume.

Figure 7A:
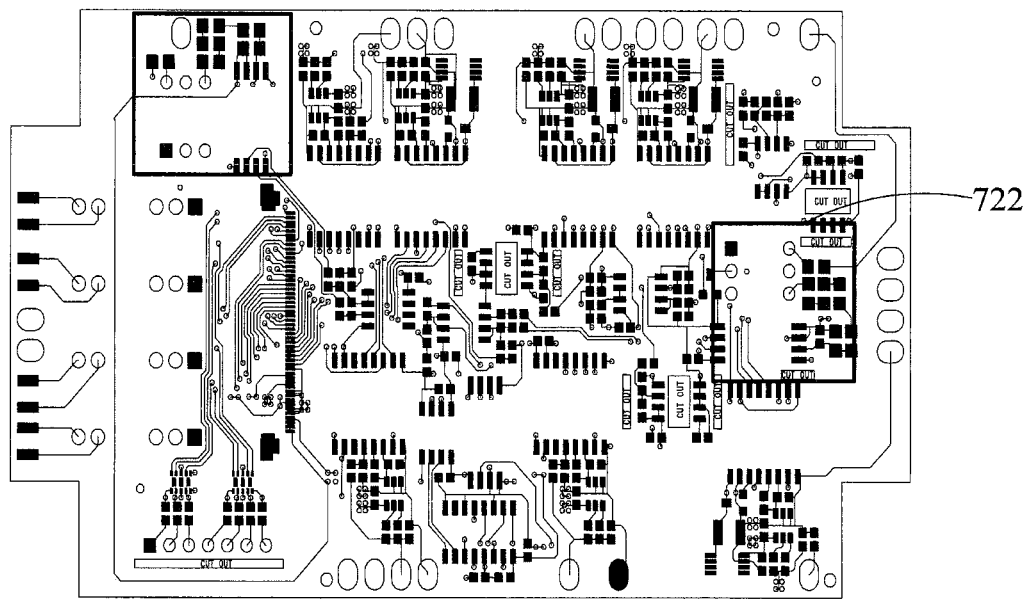
FIGS. 7A and 7B are diagrams illustrating the locations of voltage sensing elements in the intelligent diagnosis system for a power module in accordance with the disclosure.
Figure 7B:
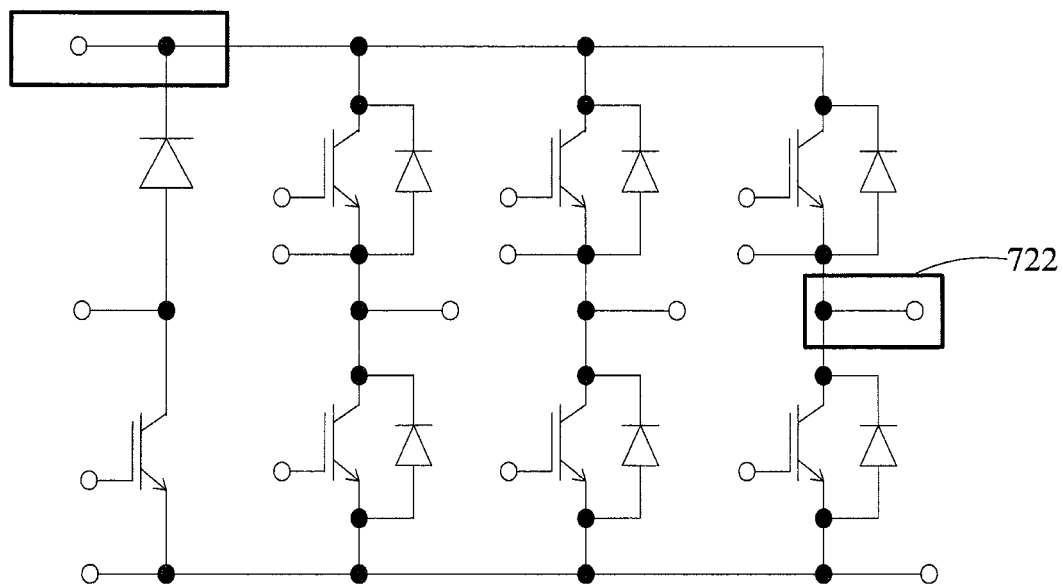

Referring to FIGS. 7A and 7B, diagrams illustrating the locations of the voltage sensing elements in the intelligent diagnosis system for a power module in accordance with the disclosure are shown. In FIG. 7A, locations of voltage sensing elements 722 in the hardware checking circuit board 22 (FIG. 2) are shown, that is, at the locations of a total voltage input and an output of one phase, that is, the output voltage and the input voltage of the power module. In other words, the voltage sensing elements are provided at the voltage output and the voltage input of the 3-phase bridge drive in the power module. The measurements provided by the voltage sensing elements 722 are subjected to a first-order filter amplification by the hardware checking module in the hardware checking circuit board 22 (FIG. 2), and are transmitted to the control board 23 (FIG. 2) for reading and analysis by the diagnostic module therein.

FIG. 7B is an equivalent circuit of FIG. 7A, which shows a 3-phase 6-arm drive circuit. The voltage sensing elements 722 are provided at the total voltage input and an output of one phase of the 3-phase 6-arm drive circuit for measuring the current output voltage and the current input voltage.

Figure 8A:
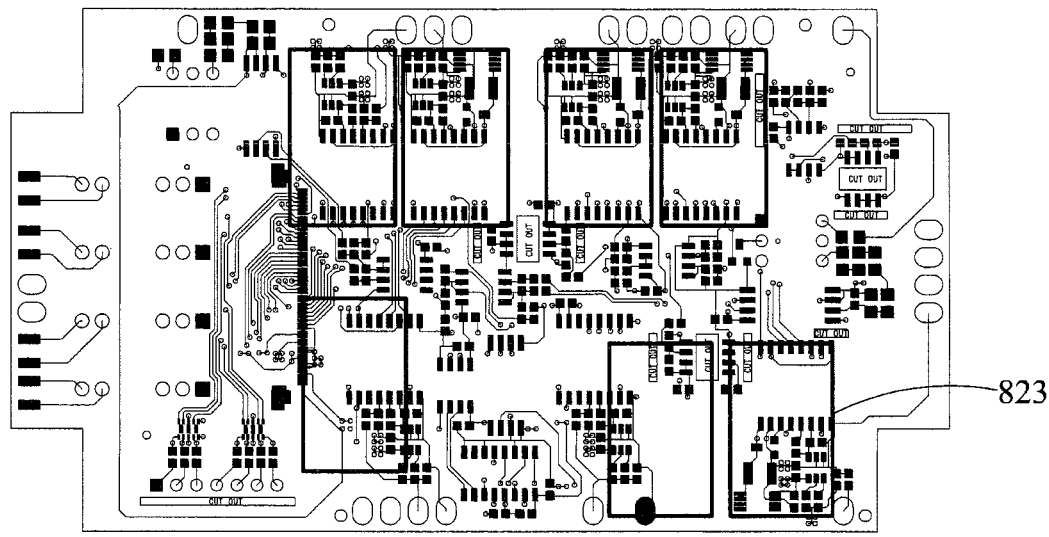
FIGS. 8A and 8B are diagrams illustrating the locations of magnetic coupling closed loop detection elements in the intelligent diagnosis system for a power module in accordance with the disclosure.
Figure 8B:
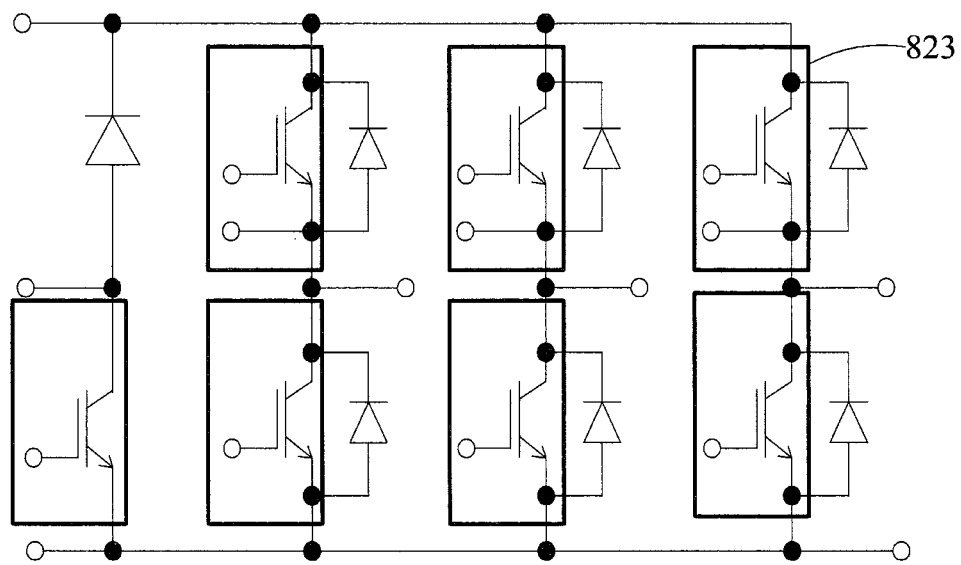

Referring to FIGS. 8A and 8B, diagrams illustrating the locations of the magnetic coupling closed loop detection elements in the intelligent diagnosis system for a power module in accordance with the disclosure are shown. In FIG. 8A, locations of magnetic coupling closed loop detection elements 823 in the hardware checking circuit board 22 (FIG. 2) are shown. There are seven magnetic coupling closed loop detection elements 823 in the power module. The power module uses the magnetic coupling closed loop concept to isolate the high and low voltage sides, and to transmit signals of the 3-phase bridge driver to the control board for confirmation of the open or closed status. The measurements provided by the magnetic coupling closed loop detection elements 823 are subjected to a first-order filter amplification by the hardware checking module in the hardware checking circuit board 22 (FIG. 2), and are transmitted to the control board 23 (FIG. 2) for reading and analysis by the diagnostic module therein.

FIG. 8B is an equivalent circuit of FIG. 8A, which shows the 3-phase 6-arm drive circuit. Six of the seven magnetic coupling closed loop detection elements 823 are provided at six insulated gate bipolar transistors of the 3-phase 6-arm drive circuit, that is, one magnetic coupling closed loop detection element 823 at each of the six insulated gate bipolar transistors of the 3-phase 6-arm drive circuit in the power module, and a seventh magnetic coupling closed loop detection element 823 at the brake arm of the power module (at the leftmost side of the diagram).

As described before, the disclosure proposes calculating a risk index based on the number of cycles operated, the temperature difference, the measured impedance, the instantaneous power and the hardware circuit self-detecting mechanism. Below illustrates how a risk index is obtained.

Before recording the risk index, the risk index is obtained from data such as temperature, current and voltage from the various sensing elements, and the level of risk can be determined based on how the risk indices are accumulated. An algorithm for obtaining a risk index is implemented through the following equations.

The number of cycles operated (Cycle Count) can be obtained from the following Eq. (1), $$\text{Cycle Count} = \frac{t_{on}}{N_{cyc}}, \quad (1)$$

wherein $t_{on}$ is the time a single arm in the 3-phase 6-arm drive circuit inside the power module has been opened, $0.1 \text{ s} < t_{on} < 60 \text{ s}$, and $N_{cyc}$ represents the number of times opened in a unit of time.

The difference (Delta T) between the current minimum temperature and the current temperature, i.e., the temperature difference, can be obtained through the following Eq. (2), $$\text{Delta} T = \int_{\Delta T}^{10} \text{Max } T - \text{Min } T \quad (2)$$

wherein Max T is the current temperature, Min T is the minimum temperature. Simply put, when the temperature starts to change, the temperature difference can be calculated from the maximum temperature and the minimum temperature at the 3-phase 6-arm drive circuit in the power module.

Impedance can be derived using the current input voltage and the output voltage, and the measured impedance can be obtained from the following Eq. (3), $$\Delta Vce[\%] = \frac{Vout}{I_{Rate}} / \frac{Vin}{I_{Rate}}, \quad (3)$$

wherein $V_{out}$ is the output voltage, $V_{in}$ is the input voltage, and $I_{Rate}$ is the input current.

Based on the above measured impedance ($\Delta$Vce), the output voltage $V_{out}$ and the input current $I_{Rate}$, an instantaneous power accumulation $P_{Rate}$ can be calculated as shown in Eq. (4) below.

$$P_{Rate} = \Delta Vce[\%] \times (Vout \times IRate) \quad (4)$$

In conjunction with the detected results of magnetic coupling closed loop, a risk index (GPR) can be calculated using Eq. (5) below.

$$GPR = \frac{P_{Rate}}{\Delta Vce} \lim_{\Delta n \to 1} \left(1 + \frac{1}{\text{Delta } T}\right)^{Cycle\ Count} \quad (5)$$

Using a pre-established table as described before, a risk index can correlate to a response time. As shown in FIG. 3, each risk index is associated with a response time under a different risk level, that is, how long before the abnormality index record is incremented once. When the risk index exceeds a predetermined value (a preset threshold), the abnormality index record can start to accumulate.

Figure 9:
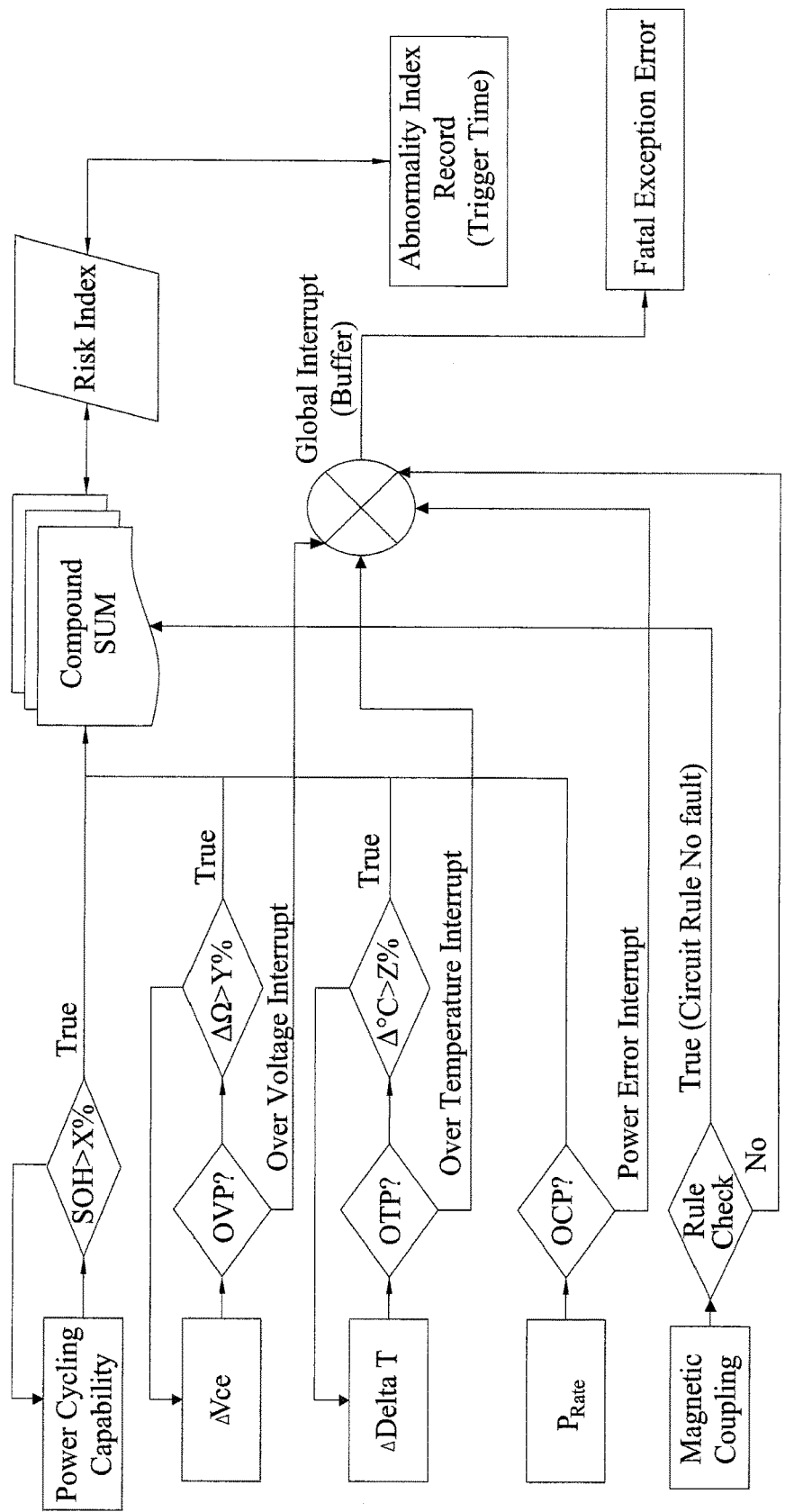
FIG. 9 is a flowchart illustrating a method for determining a risk index in accordance with the disclosure.

Referring to FIG. 9, a flowchart illustrating a method for determining a risk index in accordance with the disclosure is shown. Using the calculated risk index, power cycling capability, the measured impedance ($\Delta$Vce), the temperature difference (Delta T), the instantaneous power $P_{Rate}$ and the status of the magnetic coupling, the risk of the power module can be determined.

When the power cycling capability is measured and its state of health (SOH) is greater than a predetermined X %, the power cycling capability has a problem, and a compound SUM starts to record.

When measuring the impedance, it is first determined if there is an over voltage protection (OVP) measure. If so, over voltage interrupt is performed, and an abort command is transmitted to a global interrupt to cause the control board to stop the power module immediately. If there is no over voltage protection, it is determined if the impedance is greater than a predetermined Y %; if so, it means the measured impedance has a problem, and the compound SUM is asked to start recording; else, keep monitoring.

When measuring the temperature difference, it is first determined if there is an over-temperature protection (OTP) measure. If so, then over-temperature interrupt is performed, that is, an abort command is transmitted to a global interrupt to cause the control board to stop the power module immediately. If there is no OTP, then it is determined if the temperature is greater than a predetermined Z %, if so, then it means the temperature has a problem, and the compound SUM is asked to start recording; else, keep monitoring.

When measuring the instantaneous power, it is first determined if there is an over current protection (OCP) measure, including short circuits. If so, then power error interrupt is performed, that is, an abort command is transmitted to a global interrupt to cause the control board to stop the power module immediately. If there is no OCP, then the compound SUM is asked to keep recording the instantaneous power.

When measuring the magnetic coupling, it is first determined if an electrical rule check is passed. If not, then it means there is abnormality in the hardware loop, and this message is transmitted to a global interrupt to cause the control board to stop the power module immediately. If the electrical rule check is passed, then the compound SUM is asked to keep recording the hardware loop status. The electrical rules specify the open/close status of each of the arms during operations of the 3-phase 6-arm drive circuit under different operating conditions. For example, which of the arms are supposed to be open and which of the arms are supposed to be close. If an arm is not open or closed as it should be, the operations of the motor will be compromised.

The compound SUM is used for recording the various data above, and a risk index can then be calculated, and it is sent to a risk index area. If the risk index area finds an error in the information, it may ask the compound SUM to provide data again. If not, then it generates a corresponding response time, for example, when the risk index exceeds a certain level, then an abnormality index recording area records the abnormality. Moreover, if the abnormality index recording area finds error in the data to be recorded, it will ask the risk index area to resend the data.

A global interrupt represents a very critical condition, and the power module should stop operating immediately. If such a situation arises, it will be recorded in a fatal exception error area. This type of situation usually implies that the power module is about to be damaged or has been damaged, so data is also sent to the risk index area to be recorded in the abnormality index recording area.

Figure 10:
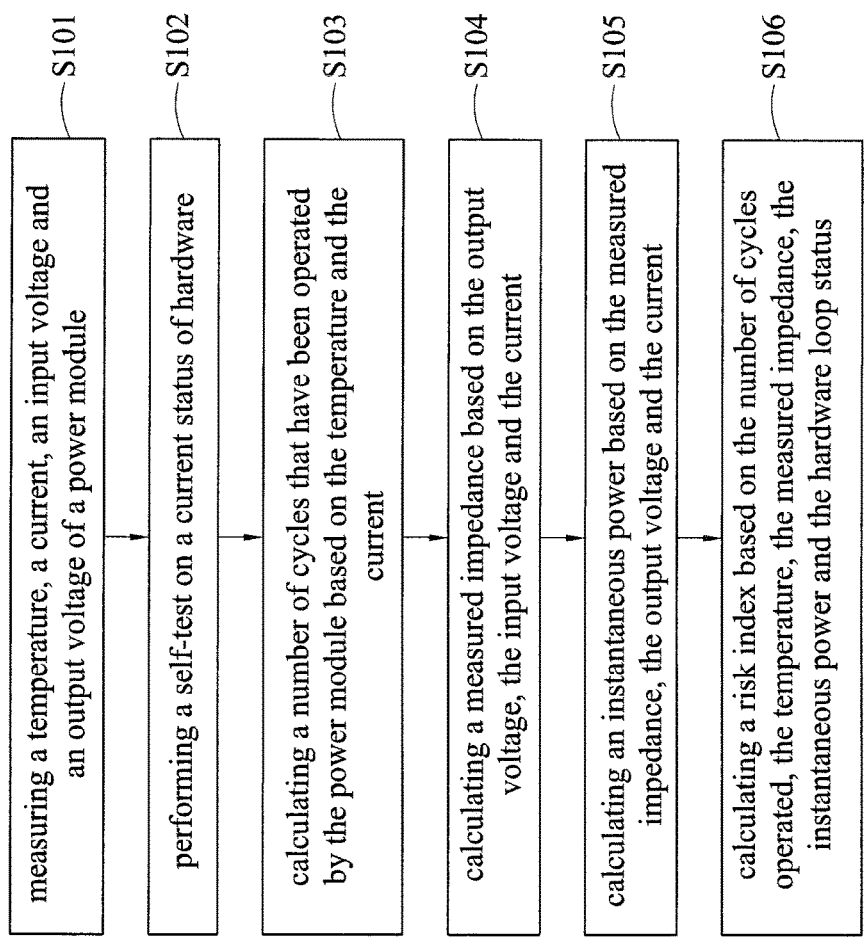
FIG. 10 is a flowchart illustrating an intelligent diagnosis method for a power module in accordance with the disclosure.

Referring to FIG. 10, a flowchart illustrating an intelligent diagnosis method for a power module in accordance with the disclosure is shown. In step S101, a temperature, a current, an input voltage and an output voltage of the power module are measured. This step measures the temperature, the current and the voltages during operations of the power module through various sensing elements.

In step S102, a hardware circuit self-test is performed. In addition to the operating data checks described earlier, step S102 further performs an all-time self-test on the current conditions of the hardware loops. If an abnormality in the loops is detected, this means there is abnormality in the operations of the power module, which in turn will cause errors in the operations of a motor connected with the power module.

In step S103, the number of cycles operated is calculated based on the temperature and the current. Step S103 calculates the number of cycles that have been operated by the power module based on the temperature and the current. The number of cycles operated means the integral of the operating time of the gate of each arm in a 3-phase 6-arm drive circuit of the power module.

In step S104, a measured impedance is calculated based on the output voltage, the input voltage and the current. Step S104 calculates the measured impedance from the voltages and the current.

In step S105, an instantaneous power is calculated based on the measured impedance, the output voltage and the current. In step S105, the instantaneous power is calculated using the measured impedance, the output voltage and the current.

In step S106, a risk index is calculated based on the number of cycles operated, the temperature, the measured impedance, the instantaneous power and the status of the hardware loops, and if the risk index is greater than a predetermined value, an abnormality index record is accumulated. In step S106, a risk index is calculated based on the various values above. This risk index indicates the level of risk of the device. In addition, when the risk index is greater than the predetermined value, the abnormality index record is accumulated. The more critical the risk, the higher the frequency of recording. A user is able to obtain the condition of the power module by looking at the abnormality index record.

Step S106 may further include generating a warning message when the abnormality index record is greater than a warning value. Simply put, the accumulation of the abnormality index record facilitates early detection of problems, but if the abnormality index record is greater than a warning value, a warning can be issued by sending out a warning message.

The above allows the user to determine if a power module is likely to be damaged or require replacement through continuous observation and recording. However, if a critical condition is detected, the power module should stop operating immediately. Therefore, when there is abnormality in the conditions of the hardware loops, or if the temperature, the measured impedance, or the instantaneous power exceeds a respective threshold, then an abort command can be generated to terminate the operations of the power module.

Figure 11:
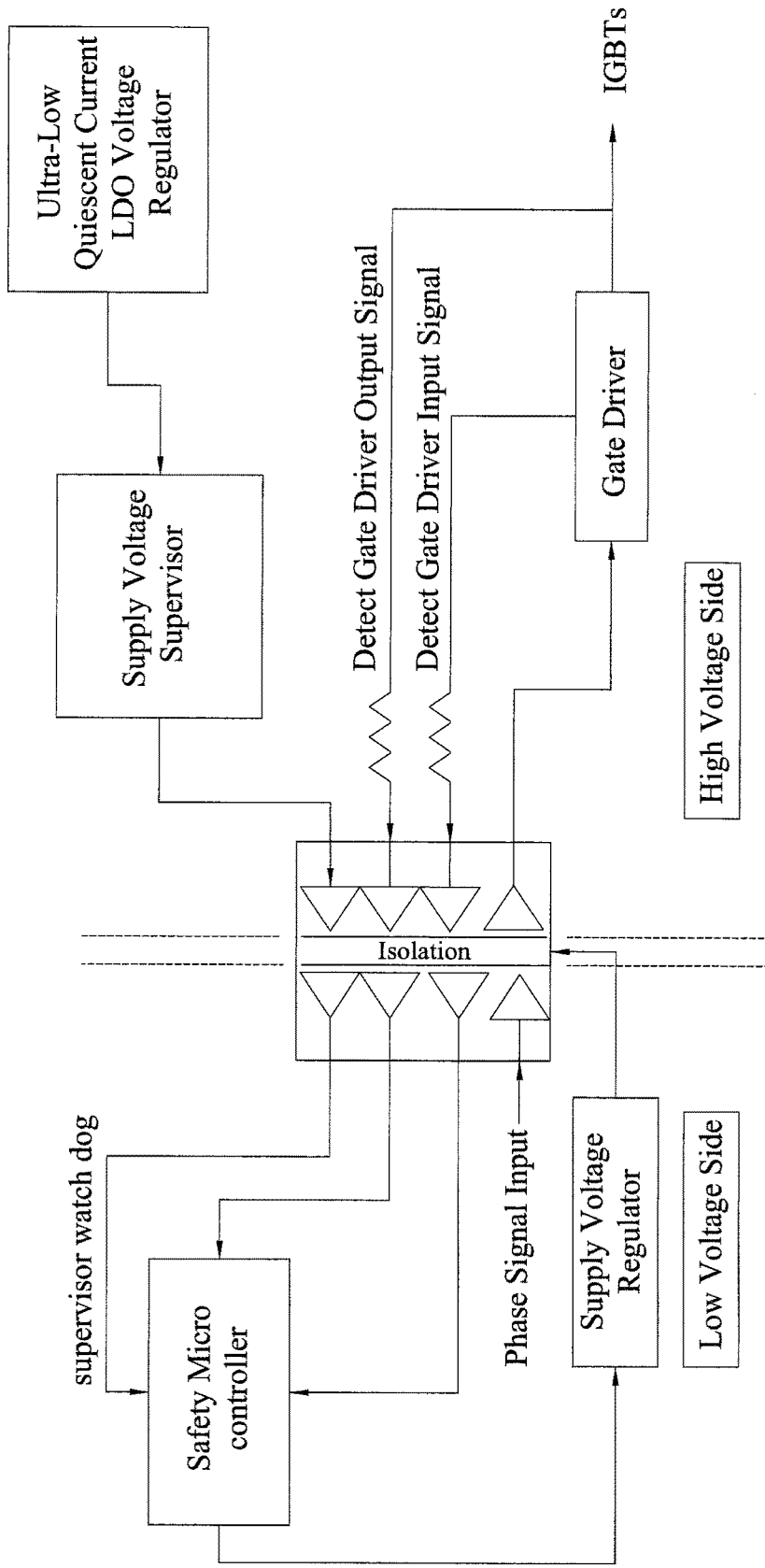
FIG. 11 is a schematic diagram illustrating a magnetic coupling closed loop detection mechanism in accordance with the disclosure.

Referring to FIG. 11, a schematic diagram illustrating a magnetic coupling closed loop detection mechanism in accordance with the disclosure is shown. A magnetic coupling closed loop detection element of the disclosure can be provided on each of the insulated gate bipolar transistors in the 3-phase bridge driver in the power module for detecting the current hardware loop status of the insulated gate bipolar transistor. The magnetic coupling closed loop detection mechanism is illustrated below with reference to FIG. 11.

The 3-phase bridge driver separates the power module into a high voltage side and a low voltage side. An ultra-low quiescent current Low Dropout (LDO) voltage regulator can supply an external power, which is transmitted to the 3-phase bridge driver after passing through a supply voltage supervisor. It is then passed to a micro controller and then to a supply voltage regulator for controlling the 3-phase bridge driver. The 3-phase bridge driver controls the gate driver for driving the insulated gate bipolar transistors (IGBTs). At this point, a gate driver output signal and a gate driver input signal are detected and returned in order to determine the hardware loop status of each arm in the power module.

In addition to voltage, current and temperature monitoring, with the magnetic coupling closed loop detection mechanism, the disclosure is further able to perform hardware circuit self-test to see if each of the arms in the 3-phase bridge driver is working properly. If abnormality occurs, then repair or replacement is carried out.

Figure 12:
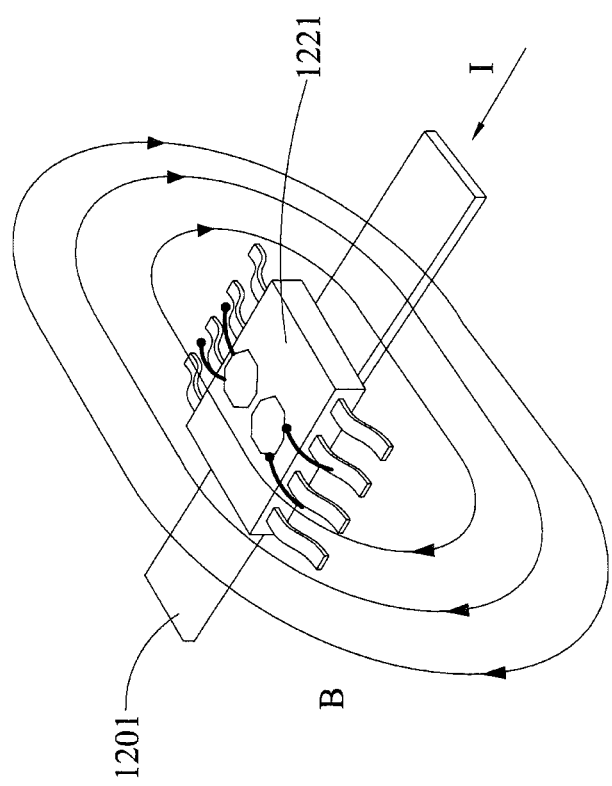
FIG. 12 is a schematic diagram depicting a current sensing element in accordance with the disclosure.

Referring to FIG. 12, a schematic diagram depicting a current sensing element in accordance with the disclosure is shown. A current sensing element 1221 in accordance with the disclosure is arranged on a lead 1201 of the power module like a surface mount device (SMD). When a current is flowing through the lead 1201, a magnetic field is created around the lead 1201. The current sensing element 1221 can then sense this magnetic field in order to work out the current flowing through the lead.

Typically, current sensing in a power module is done by attaching a sensing line to the lead and providing a current sensor outside the power module. The disclosure proposes applying a current sensing element to a lead 1201 of the power module like a surface mounted device (SMD). When a current is flowing through the lead 1201, a magnetic field is created around the lead 1201. The SMD-type current sensing element 1221 can then sense this magnetic field, and convert it to the current flowing through the lead.

With the SMD-type current sensing elements, it becomes easier to measure the currents directly through magnetic induction. Compared to the typical current sensing, even if magnetic field induction is used, the sensing element will still surround the path of the lead in order to sense the magnetic field, on the other hand, the current sensing elements of the disclosure are surface mounted directly on the leads.

In summary, the intelligent diagnosis method for a power module in accordance with the disclosure and the system thereof are able to integrate a hardware checking module and a diagnostic module into the power module, so as to obtain a risk index and determine if the power module is in immediate danger based on the risk index. If the determination result exceeds a predetermined risk index value, then an abnormality index record is incremented and stored in a re-writable memory. As such, a user is able to monitor the conditions of the power module. Through the above mechanisms, the user is able to obtain the conditions of the power module by examining the accumulation of the abnormality index record, and is able to determine if the hardware is repairing or replacement, thereby achieving ex-ante monitoring.

The above embodiments are only used to illustrate the principles of the disclosure, and should not be construed as to limit the disclosure in any way. The above embodiments can be modified by those with ordinary skill in the art without departing from the scope of the disclosure as defined in the following appended claims.

What is claimed is:

1. An intelligent diagnosis system for a power module, comprising:
a power module provided with a temperature sensing element configured for measuring a starting minimum temperature and a current temperature of the power module and determining a temperature difference between the starting minimum temperature and the current temperature;
a hardware checking module provided on one side of the power module, and including:
a current sensing element configured for sensing a current in the power module;
a voltage sensing element configured for measuring an output voltage and an input voltage of the power module; and
a magnetic coupling closed loop detection element configured for performing a self-test on a current status of the hardware to obtain a hardware loop status; and
a diagnostic module connected with the power module and the hardware checking module, and configured for calculating a number of cycles that have been operated based on the current temperature and the current sensed by the current sensing element and calculating a measured impedance based on the output voltage, the input voltage and the current, so as to calculate an instantaneous power based on the measured impedance, the output voltage and the current,
wherein the diagnostic module calculates a risk index based on the number of cycles operated, the temperature difference, the measured impedance, the instantaneous power and the hardware loop status.

2. The intelligent diagnosis system of claim 1, wherein the diagnostic module increments an abnormality index record when the risk index is greater than a predetermined value.

3. The intelligent diagnosis system of claim 2, wherein a warning is issued when the abnormality index record is greater than a warning value.

4. The intelligent diagnosis system of claim 1, wherein the diagnostic module generates an abort command to terminate operations of the power module when the hardware loop status is abnormal.

5. The intelligent diagnosis system of claim 1, wherein the diagnostic module generates an abort command to terminate operations of the power module when the temperature difference, the measured impedance or the instantaneous power exceeds their respective thresholds, respectively.

6. The intelligent diagnosis system of claim 1, wherein the temperature sensing element is provided on a three-phase circuit of a three-phase bridge driver in the power module.

7. The intelligent diagnosis system of claim 1, wherein the current sensing element is provided on U-phase, V-phase and W-phase coils of a three-phase bridge driver in the power module.

8. The intelligent diagnosis system of claim 1, wherein the voltage sensing element is provided at a voltage output and a voltage input of a three-phase bridge driver in the power module.

9. The intelligent diagnosis system of claim 1, wherein the magnetic coupling closed loop detection element is provided at each of a plurality of insulated gate bipolar transistors in a three-phase bridge driver in the power module.

10. An intelligent diagnosis method for a power module, comprising:
measuring a temperature, a current, an input voltage and an output voltage of a power module;
performing a self-test on a current status of hardware;
calculating a number of cycles that have been operated by the power module based on the temperature and the current;
calculating a measured impedance based on the output voltage, the input voltage and the current;
calculating an instantaneous power based on the measured impedance, the output voltage and the current; and
calculating a risk index based on the number of cycles operated, the temperature, the measured impedance, the instantaneous power and the hardware loop status.

11. The intelligent diagnosis method of claim 10, further comprising incrementing an abnormality index record when the risk index is greater than a predetermined value.

12. The intelligent diagnosis method of claim 11, further comprising issuing a warning when the abnormality index record is greater than a warning value.

13. The intelligent diagnosis method of claim 10, further comprising generating an abort command to terminate operations of the power module when the hardware loop status is abnormal.

14. The intelligent diagnosis method of claim 10, further comprising generating an abort command to terminate operations of the power module when the temperature, the measured impedance or the instantaneous power exceeds their respective thresholds, respectively.

15. An intelligent diagnosis system for a power module, comprising:
- a temperature sensing element configured for measuring a starting minimum temperature and a current temperature of a power module and determining a temperature difference between the starting minimum temperature and the current temperature;
- a hardware checking module provided on one side of the power module, and including:
  - a current sensing element configured for sensing a current in the power module;
  - a voltage sensing element configured for measuring an output voltage and an input voltage of the power module; and
  - a magnetic coupling closed loop detection element configured for performing a self-test on a current status of the hardware to obtain a hardware loop status; and
- a diagnostic module connected with the power module and the hardware checking module, and configured for calculating a number of cycles that have been operated based on the current temperature and the current sensed by the current sensing element and calculating a measured impedance based on the output voltage, the input voltage and the current, so as to calculate an instantaneous power based on the measured impedance, the output voltage and the current,
- wherein the diagnostic module calculates a risk index based on the number of cycles operated, the temperature difference, the measured impedance, the instantaneous power and the hardware loop status.

16. The intelligent diagnosis system of claim 15, wherein the current sensing element is provided on a lead of the power module in a surface mounted manner, and when the current is flowing through the lead and creating a magnetic field around the lead, the current sensing element senses the magnetic field and calculates a value of the current flowing through the lead.

17. The intelligent diagnosis system of claim 15, wherein the magnetic coupling closed loop detection element is provided at each of a plurality of insulated gate bipolar transistors in a three-phase bridge driver in a power module for detecting a current hardware loop status of the respective insulated gate bipolar transistors.

18. An intelligent diagnosis system for a power module, comprising:
- a hardware checking module provided on one side of a power module, and including:
  - a current sensing element configured for sensing a current in the power module;
  - a voltage sensing element configured for measuring an output voltage and an input voltage of the power module; and
  - a magnetic coupling closed loop detection element configured for performing a self-test on a current status of the hardware to obtain a hardware loop status.

\* \* \* \* \*